United States Patent
Cho

(10) Patent No.: US 7,952,943 B2
(45) Date of Patent: *May 31, 2011

(54) SEMICONDUCTOR MEMORY DEVICE HAVING LOW POWER CONSUMPTION TYPE COLUMN DECODER AND READ OPERATION METHOD THEREOF

(75) Inventor: Yong Deok Cho, Kyeongki-do (KR)

(73) Assignee: Hynix Semiconductor Inc., Icheon-si, Kyounki-do (KR)

( * ) Notice: Subject to any disclaimer, the term of this patent is extended or adjusted under 35 U.S.C. 154(b) by 24 days.

This patent is subject to a terminal disclaimer.

(21) Appl. No.: 12/252,970

(22) Filed: Oct. 16, 2008

(65) Prior Publication Data

US 2009/0046520 A1   Feb. 19, 2009

Related U.S. Application Data

(63) Continuation of application No. 11/320,855, filed on Dec. 30, 2005, now Pat. No. 7,447,083.

(30) Foreign Application Priority Data

Oct. 10, 2005   (KR) .................. 10-2005-0094947

(51) Int. Cl.
   *G11C 7/00*   (2006.01)

(52) U.S. Cl. ......... 365/189.15; 365/230.03; 365/230.06; 365/227

(58) Field of Classification Search ........... 365/189.011, 365/189.15, 230.03, 230.06, 227
See application file for complete search history.

(56) References Cited

U.S. PATENT DOCUMENTS

| | | | |
|---|---|---|---|
| 5,315,548 A | | 5/1994 | Ooishi et al. |
| 5,398,210 A | * | 3/1995 | Higuchi .................. 365/230.03 |
| 5,740,179 A | * | 4/1998 | Dorney et al. ................ 714/719 |
| 5,991,223 A | * | 11/1999 | Kozaru et al. ............ 365/230.03 |
| 6,414,530 B2 | | 7/2002 | Noda et al. |
| 6,515,913 B2 | | 2/2003 | Kajigaya et al. |
| 6,529,412 B1 | | 3/2003 | Chen et al. |
| 6,879,523 B1 | | 4/2005 | James et al. |

* cited by examiner

*Primary Examiner* — Pho M Luu
*Assistant Examiner* — Tha-o Bui
(74) *Attorney, Agent, or Firm* — Lowe Hauptman Ham & Berner LLP

(57) ABSTRACT

The present invention relates to a semiconductor memory device having a low power consumption type column decoder and read operation method thereof. In accordance with the semiconductor memory device and read operation method thereof according to the present invention, one of a plurality of decoding units of a column decoder is selectively operated according to a logic value(s) of one of some of bits of a column address signal. It is thus possible to reduce unnecessary switching current.

24 Claims, 11 Drawing Sheets

SEMICONDUCTOR MEMORY DEVICE HAVING LOW POWER CONSUMPTION TYPE COLUMN DECODER AND READ OPERATION METHOD THEREOF

CROSS REFERENCE TO RELATED APPLICATION

This application is a Continuation of U.S. Ser. No. 11/320,855, filed on Dec. 30, 2005 now U.S. Pat. No. 7,447,083. This application, in its entirety, is incorporated herein by reference.

BACKGROUND

1. Field of the Invention

The present invention relates to semiconductor devices, and more particularly, to semiconductor memory devices.

2. Discussion of Related Art

In general, a semiconductor memory device includes a column decoder that decodes a column address signal and outputs a column decoding signal in order to read data stored in a part of a plurality of memory cells connector to an activated word line.

FIG. 1 is a schematic block diagram of s semiconductor memory device in the related art. FIG. 1 shows an example of an X16 Dynamic Random Access Memory (DRAM), which has 16 data I/O pins and can process 16 data. Referring to FIG. 1, a semiconductor memory device 10 includes a memory cell array 11, a column decoder 12, main sense amplifiers 13 to 16, an I/O circuit 17 and 10 pads P1 to P16.

The memory cell array 11 has column memory cell blocks B1 to B4. The semiconductor memory device 10 includes an 8K (8×1024) number of memory cells in a column direction. In other words, one word line (e.g., WL1) is connected to an 8K number of memory cells. Each of the column memory cell blocks B1 to B4 has a 2K (2×1024) number of memory cells in a column direction. The construction of the column memory cell blocks B1 to B4 will be described in more detail below. The construction of the column memory cell blocks B1 to B4 is the same. Therefore, only the column memory cell block B1 will be described as an example. Reference will be made to an exaggerated portion of the column memory cell block B1 in FIG. 1. The column memory cell block B1 includes a plurality of memory cell mats MAT disposed in matrix form. Local I/O lines LIO0 to LIO3 parallel to word lines WL1 to WLn are disposed in twos between the memory cell mats MAT. Furthermore, local I/O lines LIO0, LIO2 parallel to the word lines WL1 to WLn are also disposed at both sides of the outmost of the memory cell mats. Furthermore, the local I/O lines LIO0 to LIO3 are respectively connected to main local I/O lines ML0 to ML3s.

The column decoder 12 decodes a column address signal (ADD_COL). The construction and operation of the column decoder 12 will be described in more detail with reference to FIG. 2. The column decoder 12 includes an address driver 21 and address decoders 22 to 25. The address driver 21 buffer a 9-bit column address signal (ADD_COL) and outputs the result to the address decoders 22 to 25. The address decoder 22 decodes the column address signal (ADD_COL) and outputs column decoding signals (DEC_A1 to DEC_A512). The address decoder 23 decodes the column address signal (ADD_COL) and outputs column decoding signals (DEC_B1 to DEC_B512). The address decoder 24 decodes the column address signal (ADD_COL) and outputs column decoding signals (DEC_C1 to DEC_C512). The address decoder 25 decodes the column address signal (ADD_COL) and outputs column decoding signals (DEC_D1 to DEC_D512).

A read operation of the semiconductor memory device 10 will now be described in short. One of (e.g., WL1) of the word lines WL1 to WLn is activated. The column decoder decodes the column address signal (ADD_COL) and outputs column decoding signals (DEC_A1 to DEC_A512), DEC_B1 to DEC_B512), DEC_C1 to DEC_C512), DEC_D1 to DEC_D512). The column decoding signals (DEC_A1 to DEC_A512) are input to the mats MAT of the column memory cell block B1, respectively. The column decoding signals (DEC_B1 to DEC_B512) are input to the mats MAT the column memory cell block B2, respectively. Furthermore, the column decoding signals (DEC_C1 to DEC_C512) are input to the mats MAT of the column memory cell block B3, respectively. The column decoding signals (DEC_D1 to DEC_D512) are input to the mats MAT of the column memory cell block B4, respectively. Some data (not shown) of the memory cells included in the mats MAT of the column memory cell block B, are loaded onto the local I/O lines LIO0 to LIO3 in response to the column decoding signals (DEC_A1 to DEC_A512). Thereafter, the data loaded onto the local I/O lines LIO0 to LIO3 are input to the main sense amplifier 13 through the main local I/O lines ML0 to ML3. In the same manner as the column memory cell block B1, data from the column memory cell blocks B2 to B4 are input to the main sense amplifiers 14 to 16 through the main local I/O lines ML4 to ML15.

The main sense amplifier 13 amplifies the data received through the main local I/O lines ML0 to ML3 and outputs the amplified data (ND0 to ND3) to global I/O lines GIO0 to GIO3. The main sense amplifiers 14 to 16 amplify data received through the main local I/O lines ML4 to ML15 and output the amplified data (ND4 to ND15) to global I/O lines GIO4 to GIO15, in the same manner as the main sense amplifier 13.

The I/O circuit 17 outputs the amplified data (ND0 to ND15), which are received through the global I/O lines GIO0 to GIO15, to the output data (DO to D1) through the IO pads P0 to P15. However, if a logic value of any one of 8 bits of the column address signal (ADD_COL) is changed in the semiconductor memory device 10, the address decoders 22 to 25 of the column decoder 12 are all operated. If the address decoders 22 to 25 are operated, a problem arises because high switching current is consumed unnecessarily.

Meanwhile, in the semiconductor memory device 10, the local I/O lines LIO0 to LIO3 included in one column memory cell block must be disposed corresponding to a 2K number of memory cells. Therefore the length (A1) of each of the local I/O lines LIO0 to LIO3 is relatively long. If the length of the local I/O line is long as described above, a voltage of data signals transferred through local I/O lines is attenuated. A problem arises because data cannot be read accurately.

SUMMARY OF THE INVENTION

An advantage of the present invention is that it provides semiconductor memory devices in which one of a plurality of decoding units of a column decoder is selectively operated according to a logic value(s) of one or some of bits of a column address signal, reducing unnecessary switching current.

Another advantage of the present invention is that it provides a read operation method of a semiconductor memory device, in which one of a plurality of decoding units of a column decoder is selectively operated according to a logic value(s) of one or some of bits of a column address signal, reducing unnecessary switching current.

A semiconductor memory device according to an aspect of the present invention includes a memory cell array, a row decoder, a column decoder, sense amplifier groups and a data I/O circuit. The memory cell array includes a plurality of column groups, each having a predetermined number of column memory blocks. Each of the predetermined number of column memory blocks includes a plurality of memory cells sharing a plurality of word lines. The row decoder decodes a row address signal and activates one of a plurality of word lines according to the decoding result. The column decoder decodes a column address signal in response to a logic value (s) of one or some of bits of the column address signal and outputs column decoding signals to one of the plurality of column groups. The sense amplifier groups are respectively connected to the plurality of column groups through main local I/O line groups. The data I/O circuit outputs output data to I/O pads in response to amplified data, which are received through global I/O lines. Each of the sense amplifier groups amplifies internal data, which are received from a corresponding one of the plurality of column groups, and outputs the amplified data to the global I/O lines, and when any one of the plurality of column groups outputs the internal data in response to the column decoding signals, the remaining column groups do not output the internal data.

A read operation method of a semiconductor memory device according to an aspect of the present invention includes the steps of activating one of a plurality of word lines; decoding a column address signal in response to logic value(s) of one of some of bits of the column address signal, and outputting column decoding signals to any one of a plurality of column groups, each having a predetermined number of column memory blocks; amplifying internal data, which are received from one of the plurality of column groups through one of main local I/O line groups correspondingly connected to the plurality of column groups, and outputting the amplified data to global I/O lines, respectively; and outputting output data to I/O pads in response to the amplified data received from the global I/O lines.

DETAILED DESCRIPTION OF PREFERRED EMBODIMENTS

The present invention will now be described in connection with preferred embodiments with reference to the accompanying drawings.

Figure 3:
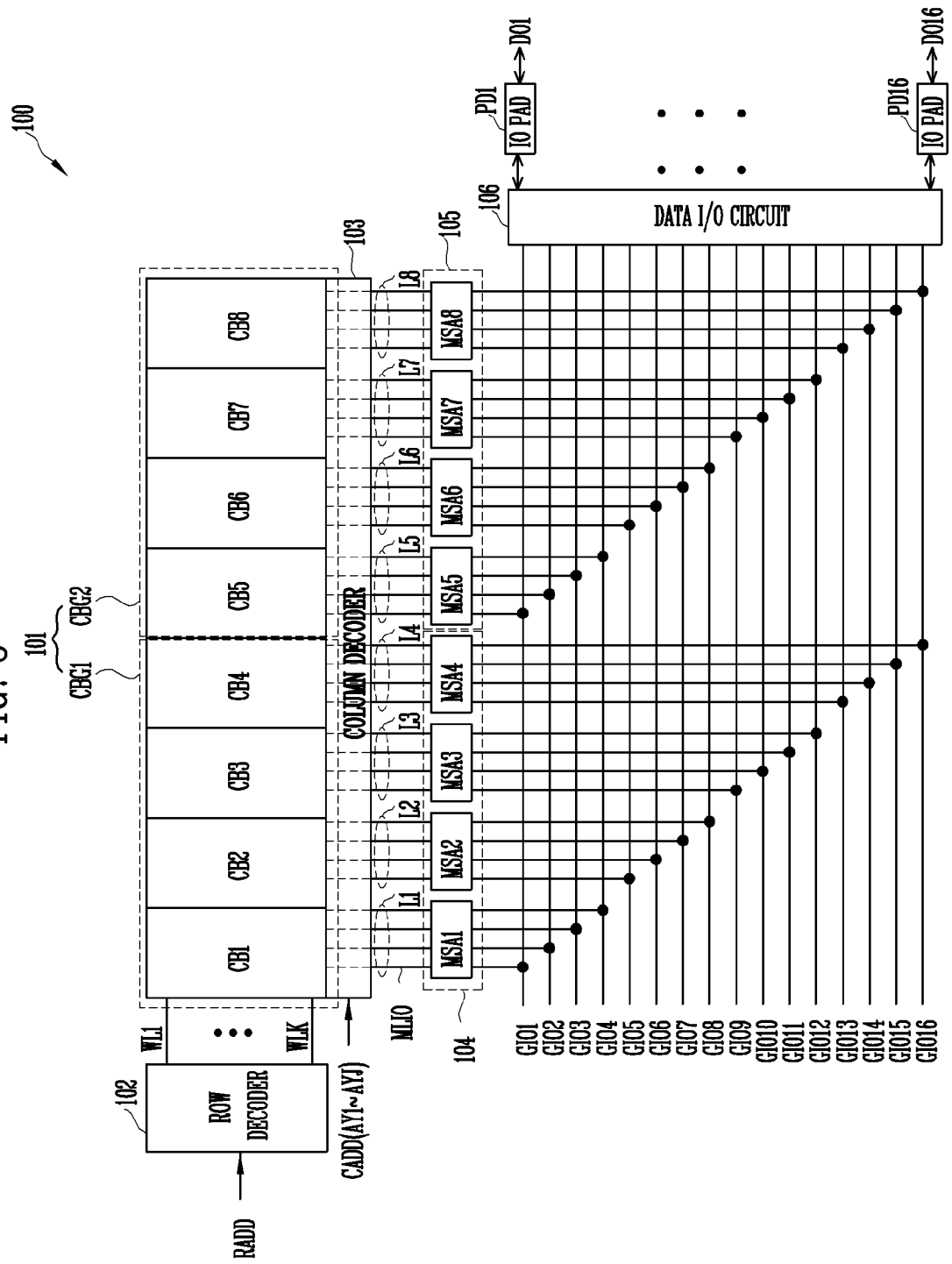
FIG. 3 is a schematic block diagram of s semiconductor memory device according to an embodiment of the present invention.

FIG. 3 is a schematic block diagram of s semiconductor memory device according to an embodiment of the present invention. FIG. 3 shows an example of an X16 DRAM in which a 16 number of data can be processed at once.

Referring to FIG. 3, a semiconductor memory device 100 includes a memory cell array 101, a row decoder 102, a column decoder 103, first and second sense amplifier groups 104, 105 and a data I/O circuit 106.

Figure 5:
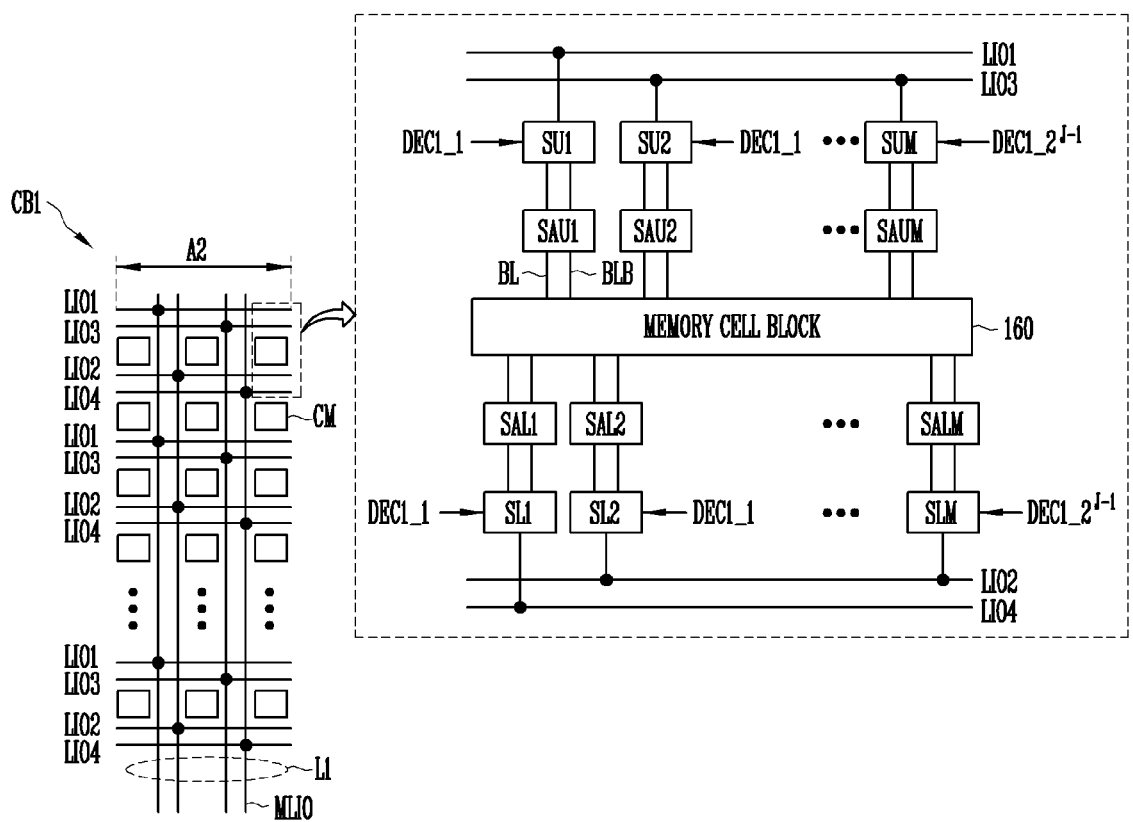
FIG. 5 is a detailed circuit diagram of a memory cell block shown in FIG. 3.

The memory cell array 101 includes first and second column groups CBG1, CBG2. The first column group CBG1 includes column memory blocks CB1 to CB4. The second column group CBG2 includes column memory blocks CB5 to CB8. Though not shown in the drawing, each of the column memory blocks CB1 to CB8 includes a plurality of memory cells that share word lines WL1 to WLK (K is an integer). The number of memory cells connected to one word line, of memory cells of each of the column memory blocks CB1 to CB8, can be set to $4\times(2^{J-1})$ (J is an integer). For example, when J is 9, the number of memory cells connected to one word line is 1K (1×1024). The construction of the column memory blocks CB1 to CB8 will be described in more detail with reference to FIG. 5.

The construction of the column memory blocks CB1 to CB8 is the same. Therefore, only the column memory block CB1 will be described as an example. The column memory block CB1 includes a plurality of memory cell mats CM disposed in matrix form. Local I/O lines LIO0 to LIO3 parallel to word lines WL1 to WLK are disposed in twos between the memory cell mats CM. Furthermore, the local I/O lines LIO0 to LIO3 are also disposed in two at both sides of the outmost side of the memory cell mats CM. The local I/O lines LIO0 to LIO3 are respectively connected to four main local I/O lines MLIO. Reference will be made to an exaggerated portion of the memory cell mat CM in FIG. 5.

The memory cell mat CM includes a memory cell block 160, sense amplifiers SAU1 to SAUM, SAL1 to SALM (M is an integer) and Y-select circuits SU1 to SUM, SL1 to SLM (M is an integer). The memory cell block 160 includes a plurality of memory cells. The sense amplifiers SAU1 to SAUM, SAL1 to SALM sense and amplify a voltage difference of bit lines BL, BLB connected to the plurality of memory cells and output read data. The Y-select circuits SU1 to SUM, SL1 to SLM output the read data, which are received from the sense amplifiers SAU1 to SAUM, SAL1 to SALM, to the local I/O lines LIO0 to LIO3, respectively, in response to column decoding signals (DEC1_1 to DEC1_$2^{J-1}$), respectively. Four Y-select circuits SU1, SU2, SL1 and SL2 are operated in response to one column decoding signal (e.g., DEC1_1).

The row decoder 102 decodes a row address signal (RADD) and activates one of the word lines WL1 to WLK according to the decoding result.

Figure 4:
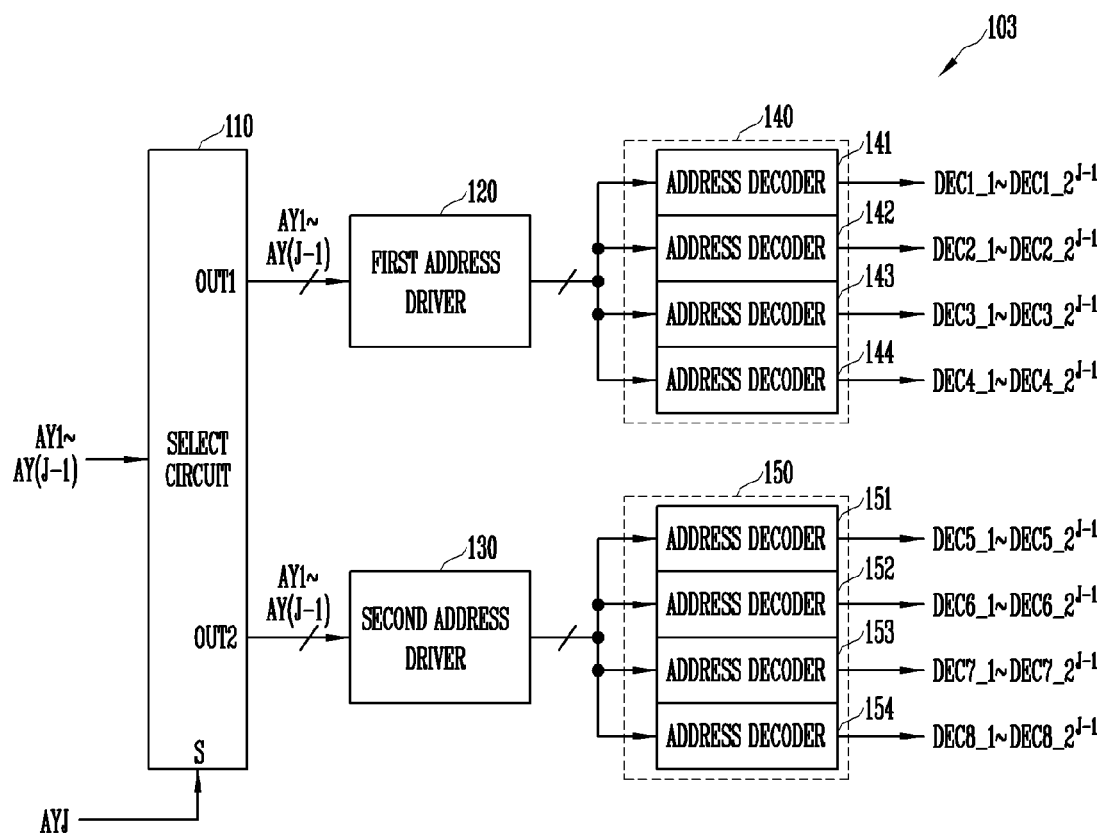
FIG. 4 is a detailed block diagram of the column decoder shown in FIG. 3.

The column decoder 103 decodes a column address signal (CADD) in response to a logic value of one (e.g., AYJ) of bits (AY1 to AYJ) (J is an integer) of the column address signal (CADD), and outputs a column decoding signals (not shown). The column decoder 103 will be described in detail below with reference to FIG. 4. The column decoder 103 includes a select circuit 110, first and second address drivers 120, 130, and first and second decoding units 140, 150.

The select circuit 110 receives the most significant bit (AYJ) of the bits (AY1 to AYJ) of the column address signal (CADD) as a select signal. The select circuit 110 can be implemented using a demultiplexer. The select circuit 110 outputs bits (AY1 to AY(J-1)) to one of the first and second output terminals OUT1, OUT2) according to a logic value of the select signal (AYJ). In more detail, the select circuit 110 outputs the bits (AY1 to AY(J-1)) to the first output terminal OUT1 when according to a logic value of the select signal (AYJ) is '0', and outputs the bits (AY1 to AY(J-1)) to a second output terminal OUT2 when a logic value of the select signal (AYJ) is '1'.

The first address driver 120 buffers the bits (AY1 to AY(J-1)) received from the first output terminal OUT1. The second address driver 130 buffers the bits (AY1 to AY(J-1)) received from the second output terminal OUT2.

The first decoding unit 140 includes address decoders 141 to 144. The address decoder 141 decodes the bits (AY1 to AY(J-1)) and outputs column decoding signals (DEC1_1 to DEC1_$2^{J-1}$) to the column memory block CB1. The address decoder 142 decodes the bits (AY1 to AY(J-1)) and outputs column decoding signals (DEC2_1 to DEC2_$2^{J-1}$) to the column memory block CB2. The address decoder 143 decodes the bits (AY1 to AY(J-1)) and outputs column decoding signals (DEC3_1 to DEC3_$2^{J-1}$) to the column memory block CB3. The address decoder 144 decodes the bits (AY1 to AY(J-1)) and outputs column decoding signals (DEC4_1 to DEC4_$2^{J-1}$) to the column memory block CB4.

The second decoding unit 150 includes address decoders 151 to 154. The address decoder 151 decodes the bits (AY1 to AY(J-1)) and outputs column decoding signals (DEC5_1 to DEC5_$2^{J-1}$) to the column memory block CB5. The address decoder 152 decodes the bits (AY1 to AY(J-1)) and outputs column decoding signals (DEC6_1 to DEC6_$2^{J-1}$) to the column memory block CB6. The address decoder 153 decodes the bits (AY1 to AY(J-1)) and outputs column decoding signals (DEC7_1 to DEC7_$2^{J-1}$) to the column memory block CB7. The address decoder 154 decodes the bits (AY1 to AY(J-1)) and outputs column decoding signals (DEC8_1 to DEC8_$2^{J-1}$) to the column memory block CB8.

Referring back to FIG. 3, in a read operation, each of the column memory blocks CB1 to CB4 outputs internal data (not shown) according to the column decoding signal. This will be described in more detail.

The column memory block CB1 outputs four-bit internal data (not shown) through main local I/O lines MLIO of a main local I/O line group (L1) in response to the column decoding signals (DEC1_1 to DEC1_$2^{J-1}$). The column memory block CB2 outputs the four-bit internal data (not shown) through main local I/O lines MLIO of a main local I/O line group (L2) in response to the column decoding signals (DEC2_1 to DEC2_$2^{J-1}$). The column memory block CB3 outputs four-bit internal data (not shown) through main local I/O lines MLIO of a main local I/O line group (L3) in response to the column decoding signals (DEC3_1 to DEC3_$2^{J-1}$). The column memory block CB4 outputs four-bit internal data (not shown) through main local I/O lines MLIO of a main local I/O line group (L4) in response to the column decoding signals (DEC4_1 to DEC4_$2^{J-1}$). In the same manner as the column memory blocks CB1 to CB4, the column memory blocks CB5 to CB8 also output internal data (not shown) through main local I/O line groups (L5 to L8) in response to the column decoding signals (DEC5_1 to DEC5_$2^{J-1}$, DEC6_1 to DEC6_$2^{J-1}$, DEC7_1 to DEC7_$2^{J-1}$ and DEC8_1 to DEC8_$2^{J-1}$), respectively. When the column memory blocks CB1 to CB4 output the internal data, the column memory blocks CB5 to CB8 do not output the internal data.

Meanwhile, in a write operation, the column memory blocks CB1 to CB4 or CB5 to CB8 receive input data (not shown) through the main local I/O line groups (L1 to L4 or L5 to L8), respectively, in response to the column decoding signals (DEC(1 to 4)_1 to DEC(1 to 4)_$2^{J-1}$, or DEC(5 to 8)_1 to DEC(5 to 8)_$2^{J-1}$).

The first sense amplifier group 104 includes main sense amplifiers MSA1 to MSA4. The main sense amplifier MSA1 amplifies the four-bit internal data, which are received form the column memory block CB1 through the main local I/O lines MLIO of the main local I/O line group (L1), and outputs the amplified data to the global I/O lines GIO1 to GIO4. The main sense amplifier MSA2 amplifies the four-bit internal data, which are received form the column memory block CB2 through the main local I/O lines MLIO of the main local I/O line group (L2), and outputs the amplified data to the global I/O lines GIO5 to GIO8. The main sense amplifier MSA3 amplifies the four-bit internal data, which are received form the column memory block CB3 through the main local I/O lines MLIO of the main local I/O line group (L3), and outputs the amplified data to the global I/O lines GIO9 to GIO12. The main sense amplifier MS4 amplifies the four-bit internal data, which are received form the column memory block CB4 through the main local I/O lines MLIO of the main local I/O line group (L4), and outputs the amplified data to the global I/O lines GIO13 to GIO16.

The second sense amplifier group 105 includes main sense amplifiers MSA5 to MSA8. The operation of the main sense amplifiers MSA5 to MSA8 is the same as that of the main sense amplifiers MSA1 to MSA4. Description thereof will be omitted for simplicity.

The data I/O circuit 106 outputs output data DO1 to DO16 to the I/O pads (PD1 to PD16) in response to the amplified data received from the main sense amplifiers MSA1 to MSA4 or MSA5 to MSA8 through the global I/O lines GIO1 to GIO16.

A read operation process of the semiconductor memory device 100 will be then described. Assuming that the column address signal (CADD) is 9 bits (i.e., bits (AY1 to AY9)) and the most significant bit (AY9) is logic '0'.

The row decoder 102 decodes the row address signal (RADD) and activates one (e.g., WL1) of the word lines WL1 to WLK according to the decoding result. The select circuit 110 of the column decoder 103 outputs the bits (AY1 to AY8) to the first output terminal OUT1 since the most significant bit (AY9) is logic '0'. The first address driver 120 outputs the bits (AY1 to AY8), which are received from the first output terminal OUT1, to the address decoders 141 to 144 of the first decoding unit 140, respectively. The address decoders 141 to 144 decode the bits (AY1 to AY8), respectively, and output the column decoding signals (DEC1_1 to DEC1_$2^{J-1}$, DEC2_1 to DEC2_$2^{J-1}$, DEC3_1 to DEC3_$2^{J-1}$ and DEC4_1 to DEC4_$2^{J-1}$) to the column memory blocks CB1 to CB4, respectively. A this time, the second address driver 130 and the second decoding unit 150 do not operate.

Consequently, the column memory blocks CB1 to CB4 output 16-bit internal data through the main local I/O line groups L1 to L4 in response to the column decoding signals (DEC1_1 to DEC1_$2^{J-1}$, DEC2_1 to DEC2_$2^{J-1}$, DEC3_1 to DEC3_$2^{J-1}$ and DEC4_1 to DEC4_$2^{J-1}$). The main sense amplifiers MSA1 to MSA4 of the first sense amplifier group 104 amplify the 16-bit internal data and output the amplified data to the global I/O lines GIO1 to GIO16. The data I/O circuit 106 outputs the output data (DO1 to DO16) to the I/O pads (PD1 to PD16) in response to the amplified data, which are received from the main sense amplifiers MSA1 to MSA4 through the global I/O lines GIO1 to GIO16.

As described above, in the semiconductor memory device 100, any one of the first and second decoding units 140, 150 of the column decoder 103 operates according to a logic value of the most significant bit (AYJ) of the column address signal (CADD). It is thus possible to significantly reduce a switching current that is unnecessarily consumed. Furthermore, since the memory cell array 101 is divided into the column memory blocks CB1 to CB8, the number of memory cells connected to one word line, of memory cells included in each of the column memory blocks CB1 to CB8 can be reduced.

Figure 1:
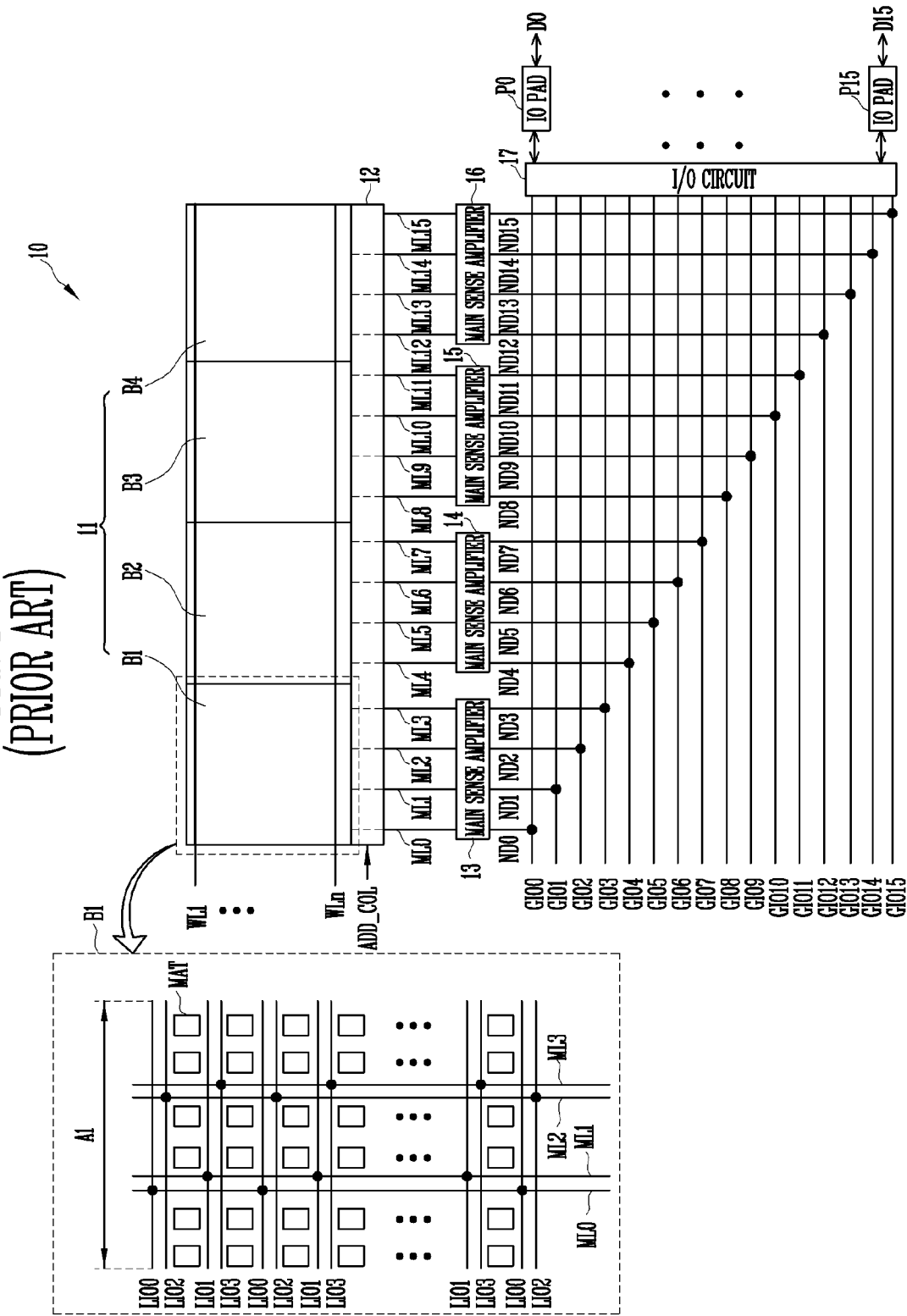
FIG. 1 is a schematic block diagram of s semiconductor memory device in the related art.
Figure 2:
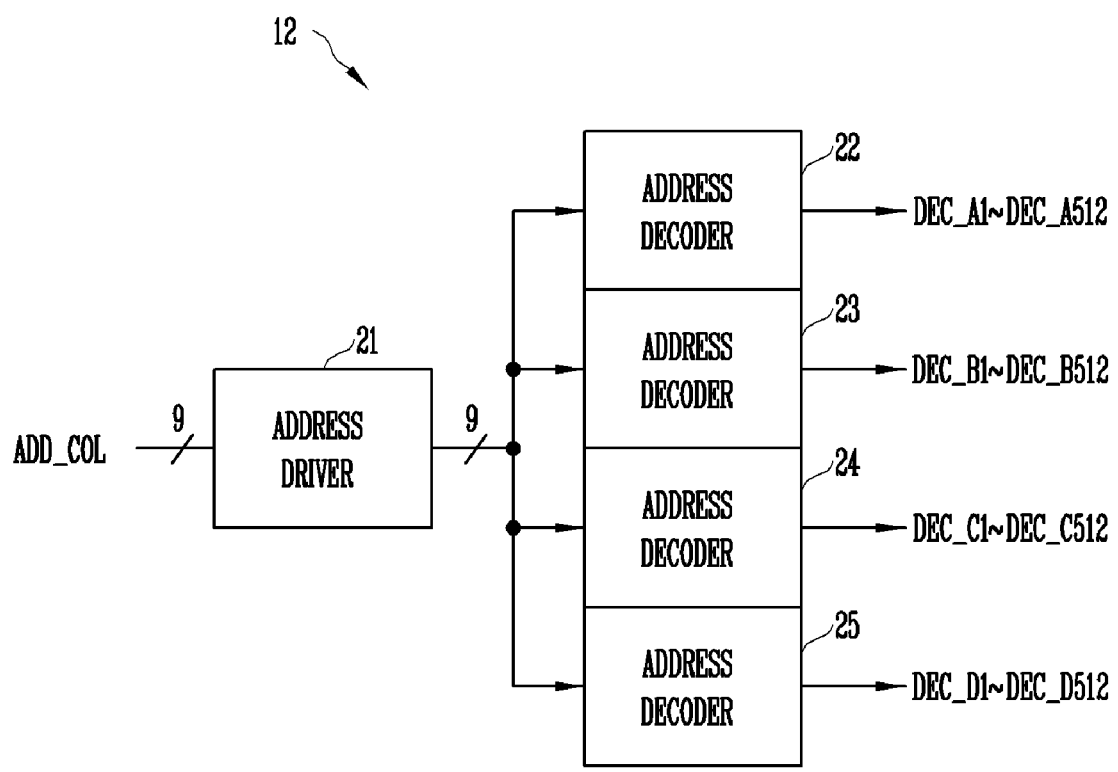
FIG. 2 is a detailed block diagram of a column decoder shown in FIG. 1.

When the number of memory cells connected to one word line is reduced as described above, the length (A2) of each of the local I/O lines LIO1 to LIO4 included in each of the column memory blocks CB1 to CB8 can be reduced. It is thus possible to a voltage of data signals, which are transferred through the local I/O lines LIO1 to L104, from being attenuated. For example, in the case of the column address signal (CADD) is 9 bits, the number of memory cell connected to one word line, of memory cells included in one column memory block (e.g., CB1) is 1K (1×1024). In this case, the length (A2) is shorter than the length (A1) shown in FIG. 1.

Figure 6:
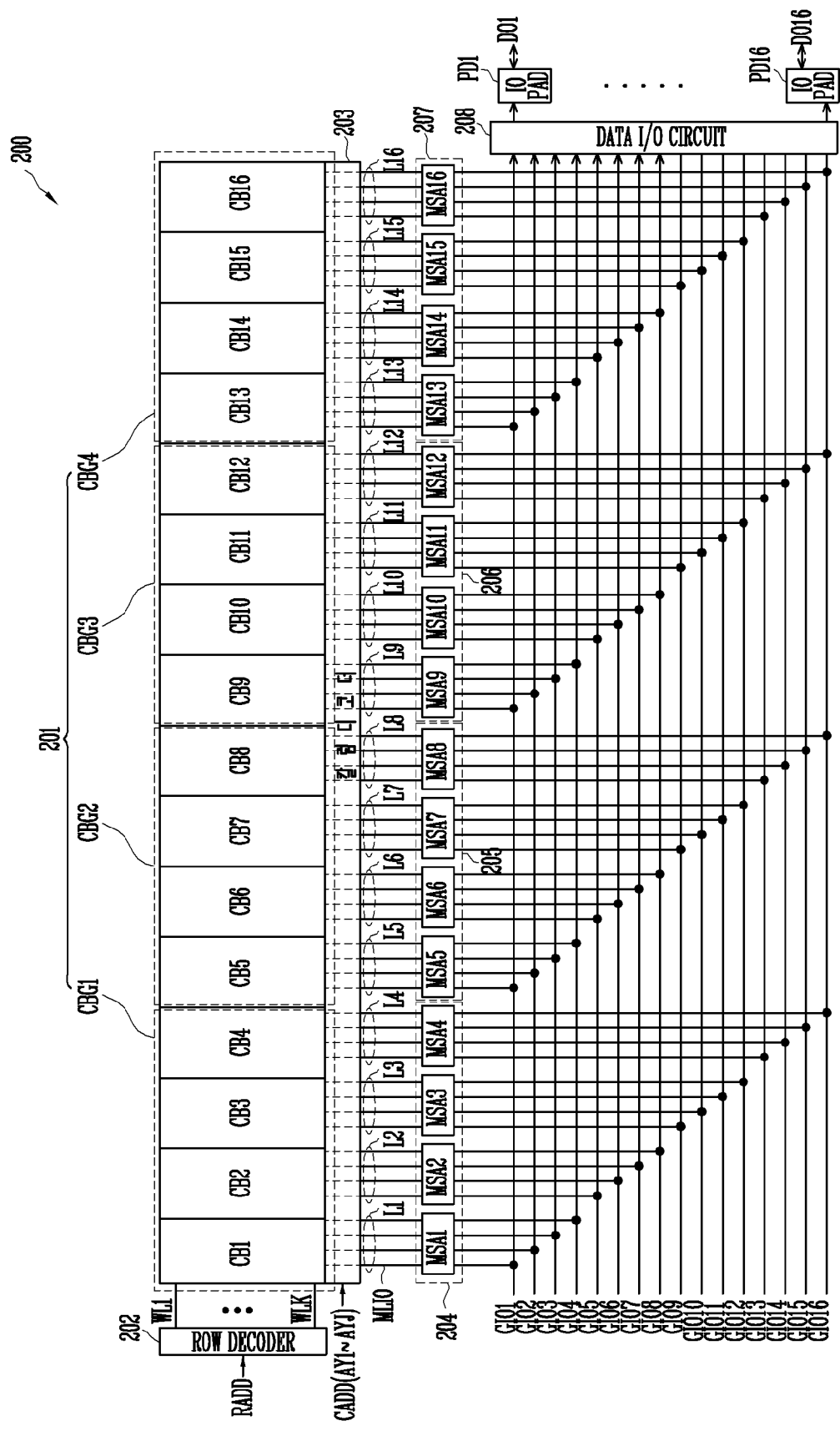
FIG. 6 is a schematic block diagram of a semiconductor memory device according to another embodiment of the present invention.

FIG. 6 is a schematic block diagram of a semiconductor memory device according to another embodiment of the present invention, and shows an example of an X16 DRAM.

Referring to FIG. 6, a semiconductor memory device 200 includes a memory cell array 201, a row decoder 202, a column decoder 203, first to fourth sense amplifier groups 204 to 207 and a data I/O circuit 208. The construction and operation of the semiconductor memory device 200 are the same as those of the semiconductor memory device 100 shown in FIG. 3 except for the memory cell array 201, the column decoder 203 and the first to fourth sense amplifier groups 204 to 207. Therefore, only the memory cell array 201, the column decoder 203 and the first to fourth sense amplifier groups 204 to 207 will be described.

The memory cell array 201 includes first to fourth column groups CBG1 to CBG4. The column group CBG1 includes column memory blocks CB1 to CB4. The column group CBG2 includes column memory blocks CB5 to CB8. The column group CBG3 includes column memory blocks CB9 to CB12. The column group CBG4 includes column memory blocks CB13 to CB16. The construction of the column memory blocks CB1 to CB16 is the same as that of the column memory block CB1 shown in FIG. 5. Description thereof will be omitted in order to avoid redundancy.

Figure 7:
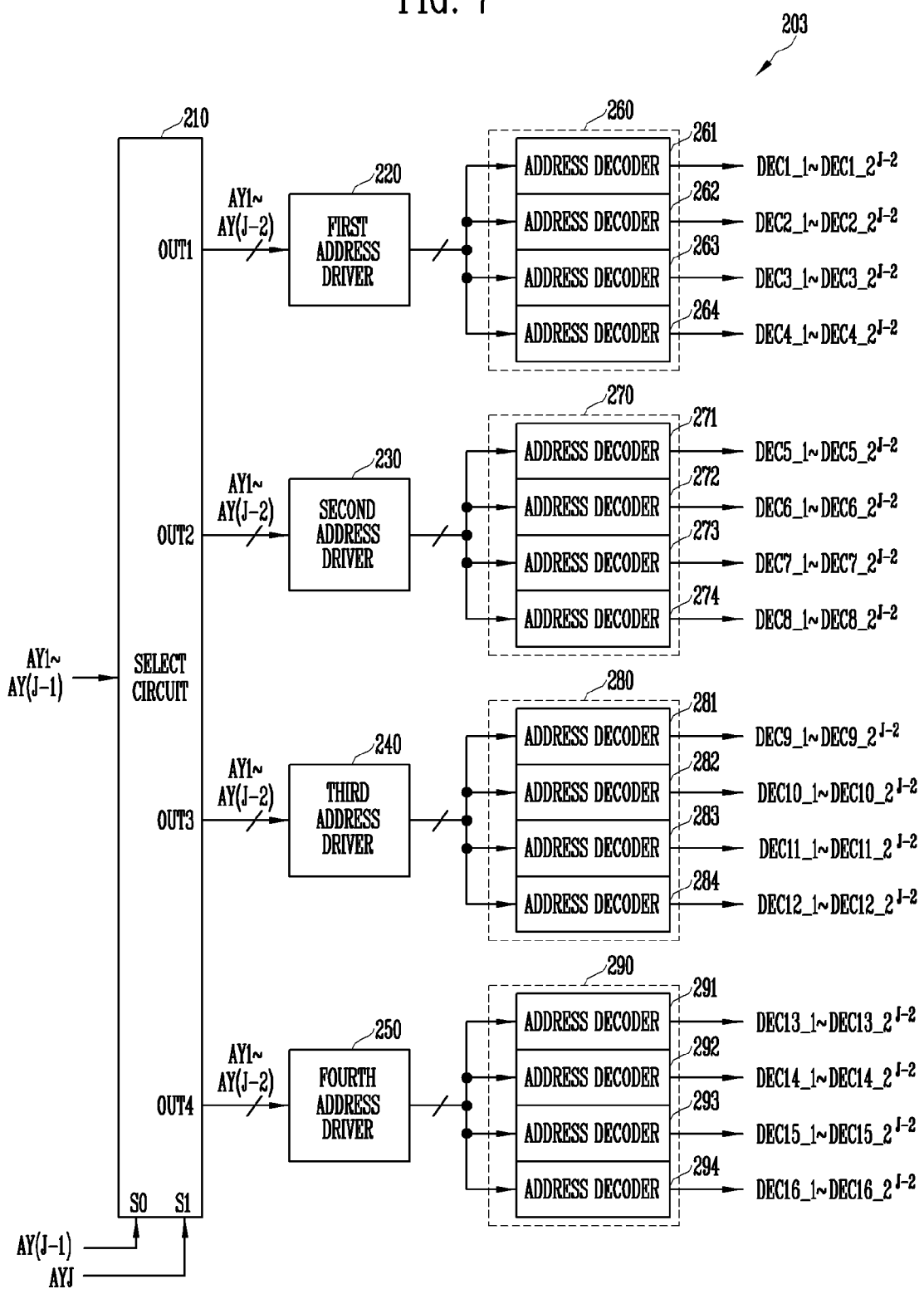
FIG. 7 is a detailed block diagram of a column decoder shown in FIG. 6.

Referring to FIG. 7, the column decoder 203 includes a select circuit 210, first to fourth address drivers 220 to 250 and first to fourth decoding units 260 to 290.

The select circuit 210 receives the most significant two bits (AYJ, AY(J-1)) of bits (AY1 to AYJ) of a column address signal (CADD) as select signals. The select circuit 210 can be implemented using a demultiplexer. Furthermore, the select circuit 210 outputs bits (AY1 to AY(J-2)) to any one of first to fourth output terminals OUT1 to OUT4 according to logic values of the select signals (AYJ, AY(J-1)). In more detail, the select circuit 210 outputs the bits (AY1 to AY(J-2)) to the first output terminal OUT1 when logic values of the select signals (AYJ, AY(J-1)) are '00', and outputs the bits (AY1 to AY(J-2)) to the second output terminal OUT2 when logic values of the select signals (AYJ, AY(J-1)) are '01'. In addition, the select circuit 210 outputs the bits (AY1 to AY(J-2)) to the third output terminal OUT3 when logic values of the select signals (AYJ, AY(J-1)) are '10'. The select circuit 210 outputs the bits (AY1 to AY(J-2)) to the fourth output terminal OUT4 when logic values of the select signals (AYJ, AY(J-1)) are '11'.

The first address driver 220 buffers the bits (AY1 to AY(J-2)) received from the first output terminal OUT1. The second address driver 230 buffers the bits (AY1 to AY(J-2)) received from the second output terminal OUT2. The third address driver 240 buffers the bits (AY1 to AY(J-2)) received from the third output terminal OUT3. The fourth address driver 250 buffers the bits (AY1 to AY(J-2)) received from the fourth output terminal OUT4.

The first decoding unit 260 includes address decoders 261 to 264. The address decoder 261 decodes the bits (AY1 to AY(J-2)) and outputs column decoding signals (DEC1_1 to DEC1_$2^{J-2}$) to the column memory block CB1. The address decoder 262 decodes the bits (AY1 to AY(J-2)) and outputs column decoding signals (DEC2_1 to DEC2_$2^{J-2}$) to the column memory block CB2. Furthermore, the address decoder 263 decodes the bits (AY1 to AY(J-2)) and outputs column decoding signals (DEC3_1 to DEC3_$2^{J-2}$) to the column memory block CB3. The address decoder 264 decodes the bits (AY1 to AY(J-2)) and outputs column decoding signals (DEC4_1 to DEC4_$2^{J-2}$) to the column memory block CB4.

The second decoding unit 270 includes address decoders 271 to 274. The address decoders 271 to 274 decode the bits (AY1 to AY(J-2)) and outputs column decoding signals (DEC5_1 to DEC5_$2^{J-2}$, DEC6_1 to DEC6_$2^{J-2}$, DEC7_1 to DEC7_$2^{J-2}$ and DEC8_1 to DEC8_$2^{J-2}$) to the column memory blocks CB5 to CB8, respectively.

The third decoding unit 280 includes address decoders 281 to 284. The address decoders 281 to 284 decode the bits (AY1 to AY(J-2)) and output column decoding signals (DEC9_1 to DEC9_$2^{J-2}$, DEC10_1 to DEC10_$2^{J-2}$, DEC11_1 to DEC11_$2^{J-2}$ and DEC12_1 to DEC12_$2^{J-2}$) to the column memory blocks CB9 to CB12, respectively.

The fourth decoding unit 290 includes address decoders 291 to 294. The address decoders 291 to 294 decode the bits (AY1 to AY(J-2)) and output column decoding signals (DEC13_1 to DEC13_$2^{J-2}$, DEC14_1 to DEC14_$2^{J-2}$, DEC15_1 to DEC15_$2^{J-2}$ and DEC16_1 to DEC16_$2^{J-2}$) to the column memory blocks CB13 to CB16, respectively.

Referring back to FIG. 6, in the read operation, the column memory blocks CB1 to CB16 output internal data (not shown) in response to corresponding column decoding signals. When one of first to fourth column groups CBG1 to CBG4 outputs internal data, the remaining column groups do not output internal data.

The first sense amplifier group 204 includes main sense amplifiers MSA1 to MSA4. The main sense amplifiers MSA1 to MSA4 are connected to the column memory blocks CB1 to CB4, respectively, through main local I/O lines MLIO of main local I/O line groups L1 to L4, respectively. The main sense amplifiers MSA1 to MSA4 amplify four-bit internal data, which are received from the column memory blocks CB1 to CB4, respectively, and output the amplified data to global I/O lines GIO1 to GIO16, respectively.

The second sense amplifier group 205 includes main sense amplifiers MSA5 to MSA8. The main sense amplifiers MSA5 to MSA8 are connected to the column memory blocks CB5 to CB8, respectively, through main local I/O lines MLIO of main local I/O line groups L5 to L8, respectively. The main sense amplifiers MSA5 to MSA8 amplify four-bit internal data, which are received from the column memory blocks CB5 to CB8, respectively, and output the amplified data to the global I/O lines GIO1 to GIO16, respectively.

The third sense amplifier group 206 includes main sense amplifiers MSA9 to MSA12. The main sense amplifiers MSA9 to MSA12 are connected to the column memory blocks CB9 to CB12, respectively, through main local I/O lines MLIO of main local I/O line groups L9 to L12, respectively. The main sense amplifiers MSA9 to MSA12 amplify the four-bit internal data, which are received from the column memory blocks CB9 to CB12, respectively, and output the amplified data to the global I/O lines GIO1 to GIO16, respectively.

The fourth sense amplifier group 207 includes main sense amplifiers MSA13 to MSA16. The main sense amplifiers MSA13 to MSA16 are connected to the column memory blocks CB13 to CB16, respectively, through main local I/O lines MLIO of main local I/O line groups L13 to L16, respectively. The main sense amplifiers MSA13 to MSA16 amplify four-bit internal data, which are received form the column memory blocks CB13 to CB16, respectively, and output the amplified data to the global I/O lines GIO1 to GIO16, respectively.

Figure 8:
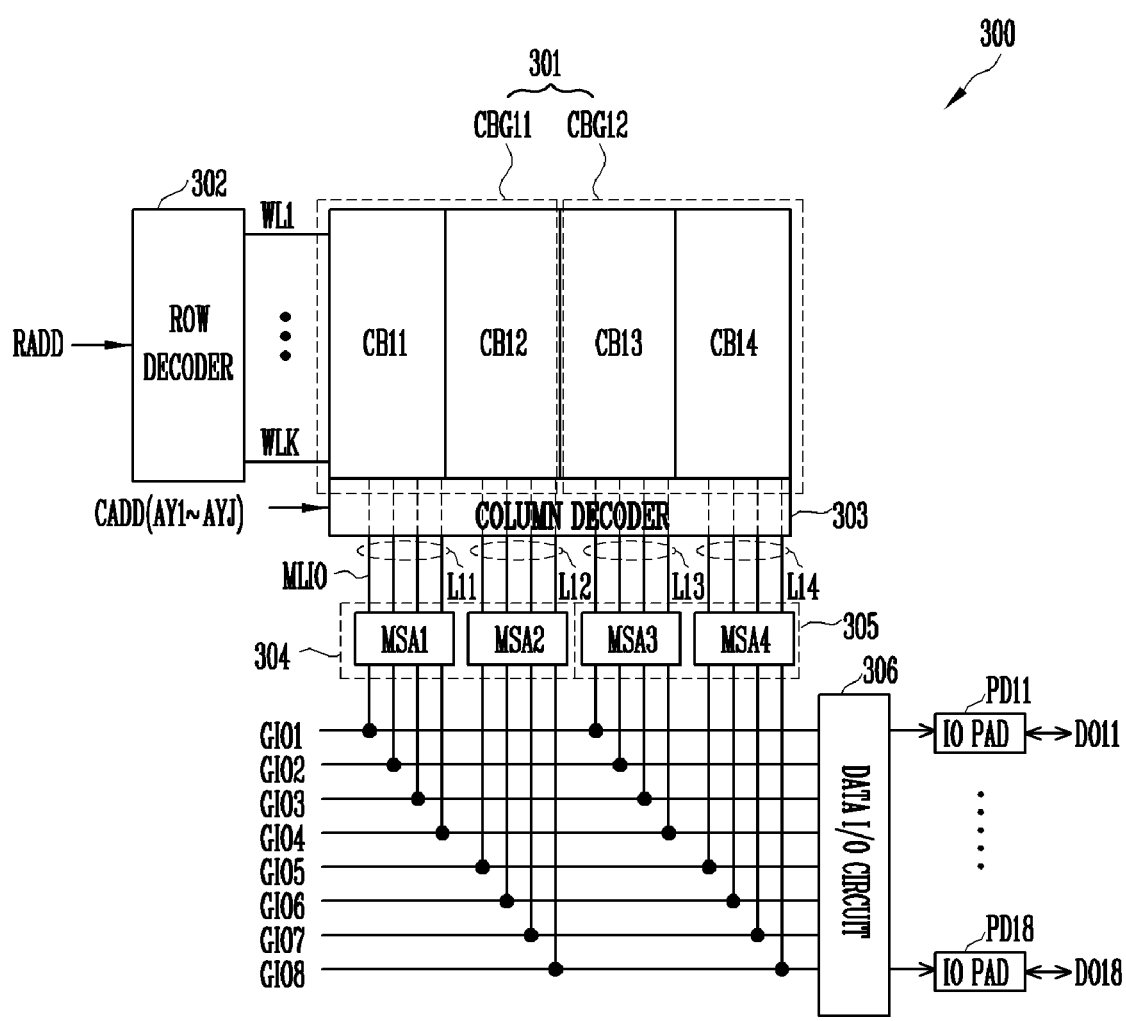
FIG. 8 is a schematic block diagram of s semiconductor memory device according to further another embodiment of the present invention.

FIG. 8 is a schematic block diagram of s semiconductor memory device according to further another embodiment of the present invention, and shows an example of an X8 DRAM, which ca process an 8 number of data at once. Referring to FIG. 8, a semiconductor memory device 300 includes a memory cell array 301, a row decoder 302, a column decoder 303, first and second sense amplifier groups 304, 305, and a data I/O circuit 306.

The construction and operation of the semiconductor memory device 300 is the same as those of the semiconductor memory device 100 shown in FIG. 3 except for the memory cell array 301, the column decoder 303, the first and second sense amplifier groups 304, 305, and the number of global I/O lines. Therefore, only the memory cell array 301, the column decoder 303, and the first and second sense amplifier groups 304, 305 will be describe with reference to FIG. 8.

The memory cell array 301 includes first and second column groups CBG11, CBG12. The first column group CBG11 includes column memory blocks CB11, CB12 and the second column group CBG12 includes column memory blocks CB13, CB14. Though not shown in the drawing, each of the column memory blocks CB11 to CB14 includes a plurality of memory cells that share word lines WL1 to WLK (K is an integer). The number of memory cells connected to one word line, of memory cells of each of the column memory blocks CB11 to CB14, can be $4 \times (2^{J-1})$ (J is an integer). For example, when J is 9 (i.e., the column address signal is 9 bits), the number of memory cells connected to one word line is 1K (1×1024). The construction of the column memory blocks CB11 to CB14 is the same as that of the column memory block CB1, which has been described with reference to FIG. 5. Description thereof will be omitted for simplicity.

Figure 9:
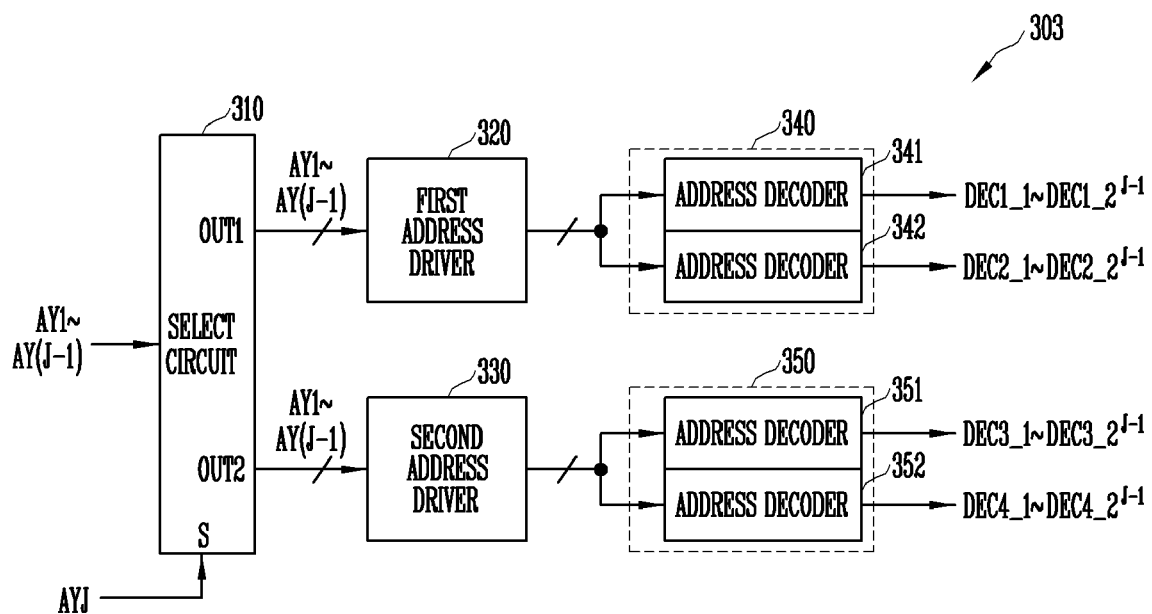
FIG. 9 is a detailed block diagram of a column decoder shown in FIG. 8.

The column decoder 303 decodes a column address signal (CADD) in response to a logic value of one (e.g., AYJ) of bits (AY1 to AYJ) (J is an integer) of a column address signal (CADD) and outputs column decoding signals (not shown). The column decoder 303 will be described in more detail with reference to FIG. 9.

The column decoder 303 includes a select circuit 310, first and second address drivers (320, 330), and first and second decoding units 340, 350.

The select circuit 310 receives the most significant bit (AYJ) of the bits (AY1 to AYJ) of the column address signal (CADD) as a select signal. The select circuit 310 can be implemented using a demultiplexer. The select circuit 310 outputs bits (AY1 to AY(J-1)) to any one of first and second output terminals OUT1, OUT2 according to a logic value of the select signal (AYJ). In more detail, the select circuit 310 outputs the bits (AY1 to AY(J-1)) to the first output terminal OUT1 when a logic value of the select signal (AYJ) is '0' and outputs, the bits (AY1 to AY(J-1)) to the second output terminal OUT2 when a logic value of the select signal (AYJ) is '1'.

The first address driver 320 buffers the bits (AY1 to AY(J-1)) received from the first output terminal OUT1. The second address driver 330 buffers the bits (AY1 to AY(J-1)) received from the second output terminal OUT2.

The first decoding unit 340 includes address decoders 341, 342. The address decoder 341 decodes the bits (AY1 to AY(J-1)) and outputs column decoding signals (DEC1_1 to DEC1_$2^{J-1}$) to the column memory block CB11. The address decoder 342 decodes the bits (AY1 to AY(J-1)) and outputs column decoding signals (DEC2_1 to DEC2_$2^{J-1}$) to the column memory block CB12.

The second decoding unit 350 includes address decoders 351, 352. The address decoder 351 decodes the bits (AY1 to AY(J-1)) and outputs column decoding signals (DEC3_1 to DEC3_$2^{J-1}$) to the column memory block CB13. The address decoder 352 decodes the bits (AY1 to AY(J-1)) and outputs column decoding signals (DEC4_1 to DEC4_$2^{J-1}$) to the column memory block CB14.

Referring back to FIG. 8, in the read operation, each of the column memory blocks CB11 to CB14 outputs internal data (not shown) according to a column decoding signal. This will be described in more detail below.

The column memory block CB11 outputs four-bit internal data (not shown) through main local I/O lines MLIO of a main local I/O line group (L11) in response to the column decoding signals (DEC1_1 to DEC1_$2^{J-1}$). The column memory block CB12 outputs four-bit internal data (not shown) through main local I/O lines MLIO of a main local I/O line group (L12) in response to the column decoding signals (DEC2_1 to DEC2_$2^{J-1}$). The column memory block CB13 outputs four-bit internal data (not shown) through main local I/O lines MLIO of a main local I/O line group (L13) in response to the column decoding signals (DEC3_1 to DEC3_$3^{J-1}$). The column memory block CB14 outputs four-bit internal data (not shown) through main local I/O lines MLIO of a main local I/O line group (L14) in response to the column decoding signals (DEC4_1 to DEC4_$2^{J-1}$). When the column memory blocks CB11, CB12 output the internal data, the column memory blocks CB13, CB14 do not output the internal data.

The first sense amplifier group 304 includes main sense amplifiers MSA1, MSA2. The main sense amplifier MSA1 amplifies the four-bit internal data, which are received from the column memory block CB11 through the main local I/O lines MLIO of the main local I/O line group (L11), and outputs the amplified data to global I/O lines GIO1 to GIO4. The main sense amplifier MSA2 amplifies the four-bit internal data, which are received from the column memory block CB12 through the main local I/O lines MLIO of the main local I/O line group (L12), and outputs the amplified data to global I/O lines GIO5 to GIO8. The main sense amplifier MSA3 amplifies the four-bit internal data, which are received from the column memory block CB13 through the main local I/O lines MLIO of the main local I/O line group (L13), and outputs the amplified data to global I/O lines GIO1 to GIO4. The main sense amplifier MSA14 amplifies the four-bit internal data, which are received from the column memory block CB14 through the main local I/O lines MLIO of the main local I/O line group (L14), and outputs the amplified data to global I/O lines GIO5 to GIO8.

The data I/O circuit 306 outputs output data (DO11 to DO18) to I/O pads PD11 to PD18 in response to the amplified data, which are received from the main sense amplifiers MSA1, MSA2 or MSA3, MSA4 from the global I/O lines GIO1 to GIO8.

Figure 10:
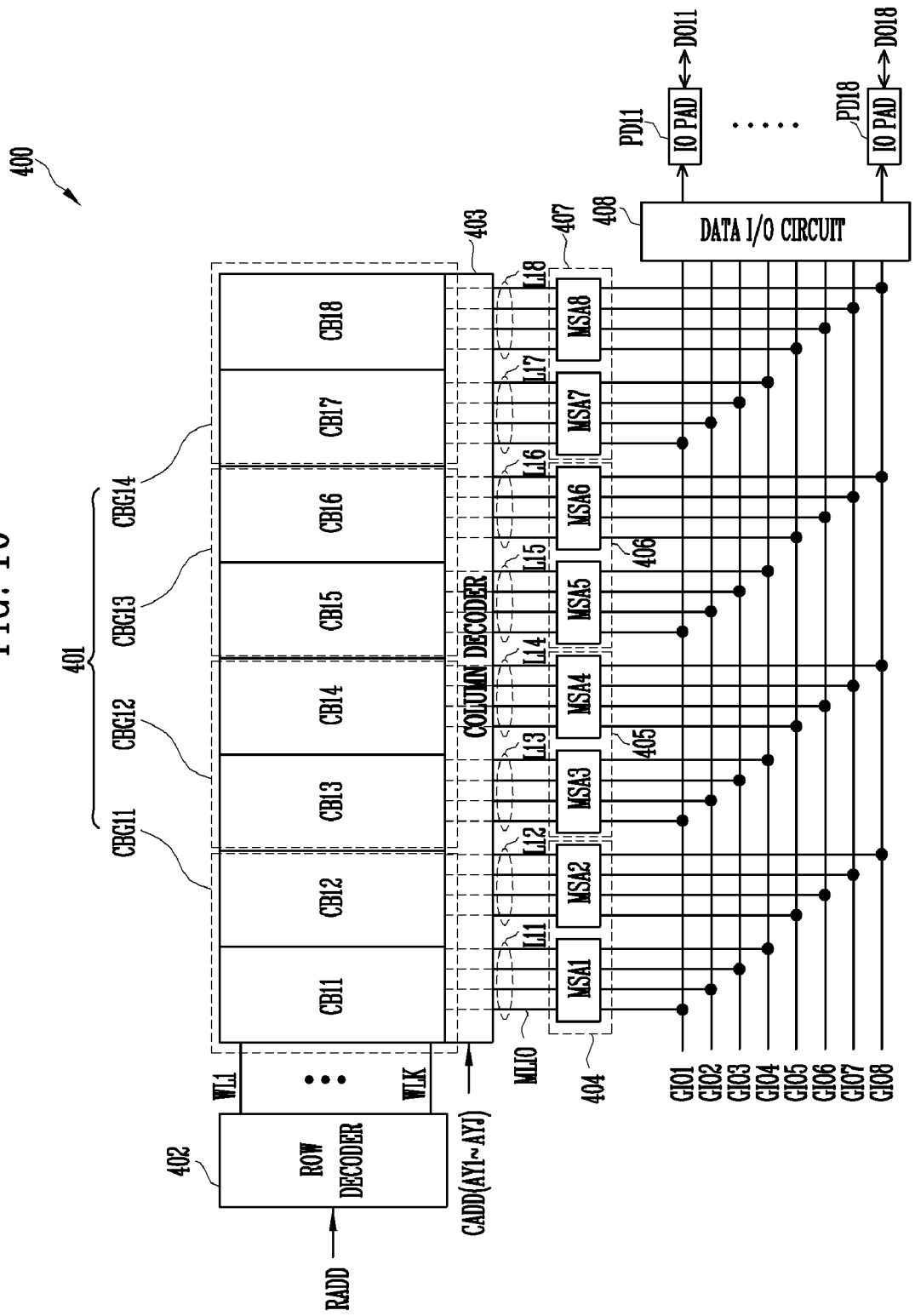
FIG. 10 is a schematic block diagram of s semiconductor memory device according to further another embodiment of the present invention.

FIG. 10 is a schematic block diagram of s semiconductor memory device according to further another embodiment of the present invention, and shows an X8 DRAM which can process an 8 number of data at once.

Referring to FIG. 10, a semiconductor memory device 400 includes a memory cell array 401, a row decoder 402, a column decoder 403, first to fourth sense amplifier groups 404 to 407, and a data I/O circuit 408. The construction and operation of the semiconductor memory device 400 are the same as those of the semiconductor memory device 300 shown in FIG. 8 except for the memory cell array 401, the column decoder 403, and the first to fourth sense amplifier groups 404 to 407. Therefore, only the memory cell array 401, the column decoder 403, and the first to fourth sense amplifier groups 404 to 407 will be described with reference to FIG. 10.

The memory cell array 401 includes first to fourth column groups CBG11 to CBG14. The column group CBG11 includes column memory blocks CB11, CB12 and the column group CBG12 includes column memory blocks CB13, CB14. The column group CBG13 includes column memory blocks CB15, CB16 and the column group CBG14 includes column memory blocks CB17, CB18. In this case, the construction of the column memory blocks CB11 to CB18 is the same as that of column memory block CB1 that has been described in detail with reference to FIG. 5. Description thereof will be omitted for simplicity.

Figure 11:
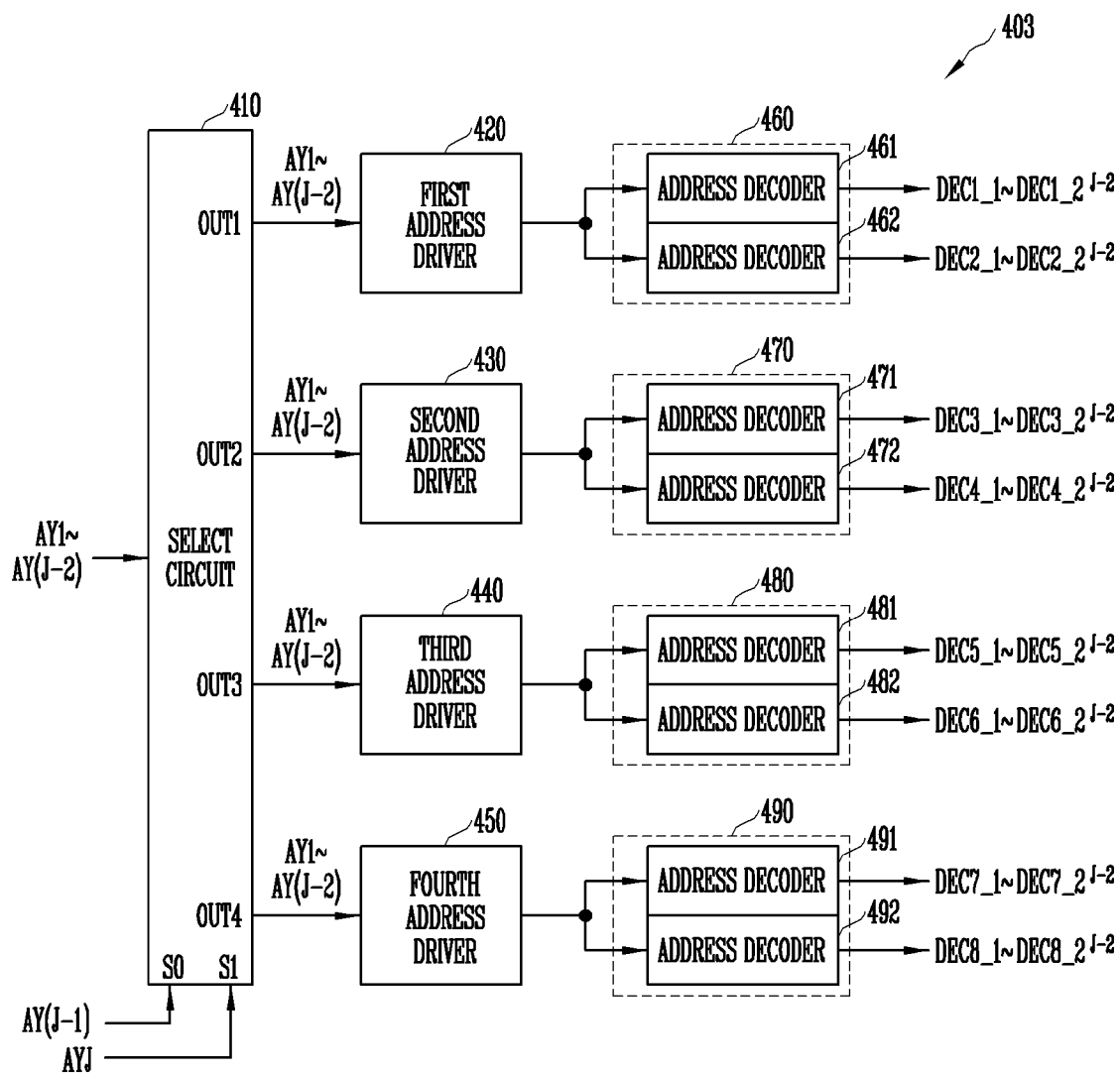
FIG. 11 is a detailed block diagram of a column decoder shown in FIG. 10.

Referring to FIG. 11, the column decoder 403 includes a select circuit 410, first to fourth address drivers 420 to 450 and first to fourth decoding units 460 to 490.

The select circuit 410 receives the most significant two bits (AYJ, AY(J-1)) of bits (AY1 to AYJ) of a column address signal (CADD) as select signals. The select circuit 410 can be implemented using a demultiplexer. The select circuit 410 outputs bits (AY1 to AY(J-2)) to any one of first to fourth output terminals OUT1 to OUT4 according to logic values of the select signals (AYJ, AY(J-1)). In more detail, the select circuit 410 outputs the bits (AY1 to AY(J-2)) to the first output terminal OUT1 when logic values of the select signals (AYJ, AY(J-1)) are '00' and outputs the bits (AY1 to AY(J-2)) to the second output terminal OUT2 when logic values of the select signals (AYJ, AY(J-1)) are '01'. In addition, the select circuit 410 outputs the bits (AY1 to AY(J-2)) to the third output terminal OUT3 when logic values of the select signals (AYJ, AY(J-1)) are '10'. The select circuit 410 outputs the bits (AY1 to AY(J-2)) to the fourth output terminal OUT4 when logic values of the select signals (AYJ, AY(J-1)) are '11'.

The first address driver 420 buffers the bits (AY1 to AY(J-2)) received from the first output terminal OUT1. The second address driver 430 buffers the bits (AY1 to AY(J-2)) received from the second output terminal OUT2. The third address driver 440 buffers the bits (AY1 to AY(J-2)) received from the third output terminal OUT3. The fourth address driver 450 buffers the bits (AY1 to AY(J-2)) received from the fourth output terminal OUT4.

The first decoding unit 460 includes address decoders 461, 463. The address decoder 461 decodes the bits (AY1 to AY(J-2)) and outputs column decoding signals (DEC1_1 to DEC1_$2^{J-2}$) to the column memory block CB11. The address decoder 462 decodes the bits (AY1 to AY(J-2)) and outputs column decoding signals (DEC2_1 to DEC2_$2^{J-2}$) to the column memory block CB12.

The second decoding unit 470 includes address decoders 471, 472. The address decoder 471 decodes bits (AY1 to AY(J-2)) and outputs column decoding signals (DEC3_1 to DEC3_$2^{J-2}$) to the column memory block CB13. The address decoder 472 decodes the bits (AY1 to AY(J-2)) and outputs column decoding signals (DEC4_1 to DEC4_$2^{J-2}$) to the column memory block CB14.

The third decoding unit 480 includes address decoders 481, 482. The address decoder 481 decodes the bits (AY1 to AY(J-2)) and outputs column decoding signals (DEC5_1 to DEC5_$2^{J-2}$) to the column memory block CB15. The address decoder 482 decodes the bits (AY1 to AY(J-2)) and outputs column decoding signals (DEC6_1 to DEC6_$2^{J-2}$) to the column memory block CB16.

The third decoding unit 490 includes the address decoders 491, 492. The address decoder 491 decodes the bits (AY1 to AY(J-2)) and outputs column decoding signals (DEC7_1 to DEC7_$2^{J-2}$) to the column memory block CB17. The address decoder 492 decodes the bits (AY1 to AY(J-2)) and outputs column decoding signals (DEC8_1 to DEC8_$2^{J-2}$) to the column memory block CB18.

Referring back to FIG. 10, in the read operation, the column memory blocks CB11 to CB18 output internal data (not shown) according to the column decoding signals. When any one of the first to fourth column groups CBG11 to CBG14 outputs the internal data, the remaining column groups do not output the internal data.

The first sense amplifier group 404 includes main sense amplifiers MSA1, MSA2. The main sense amplifiers MSA1, MSA2 are connected to the column memory blocks CB11, CB12, respectively, through the main local I/O lines MLIO of the main local I/O line groups (L11, L12.) The main sense amplifiers MSA1, MSA2 amplify the four-bit internal data, which are received from the column memory blocks CB11, CB12, respectively, and output the amplified data to global I/O lines GIO0 to GIO8, respectively.

The second sense amplifier group 405 includes the main sense amplifiers MSA3, MSA4. The main sense amplifiers MSA3, MSA4 are connected to the column memory blocks CB13, CB14, respectively, through the main local I/O lines MLIO of the main local I/O line groups (L13, L14), respectively. The main sense amplifiers MSA3, MSA4 amplify the four-bit internal data, which are received from the column memory blocks CB13, CB14, respectively, and output the amplified data to the global I/O lines GIO1 to GIO8.

The third sense amplifier group 406 includes the main sense amplifiers MSA5, MSA6. The main sense amplifiers MSA5, MSA6 are connected to the column memory blocks CB15, CB16, respectively, through the main local I/O lines MLIO of the main local I/O line groups (L15, L16), respectively. The main sense amplifiers MSA5, MSA6 amplify four-bit internal data, which are received from the column memory blocks CB15, CB16, respectively, and output the amplified data to the global I/O lines GIO1 to GIO8.

The fourth sense amplifier group 407 includes the main sense amplifiers MSA7, MSA8. The main sense amplifiers MSA7, MSA8 are connected to the column memory blocks CB17, CB18, respectively, through the main local I/O lines MLIO of the main local I/O line groups (L17, L18), respectively. The main sense amplifiers MSA7, MSA8 amplify the four-bit internal data, respectively, which are received from the column memory blocks CB17, CB18, and output the amplified data to the global I/O lines GIO1 to GIO8.

In the semiconductor memory device and read operation method thereof, any one of a plurality of decoding units of a column decoder is selectively driven. It is thus possible to reduce unnecessary switching current.

Furthermore, in the semiconductor memory device and read operation method thereof according to the present invention, the number of memory cell connected to one word line, of memory cells included in each of column memory blocks, is reduced. Therefore, the length of a local I/O line can be shortened and a voltage of data signals transferred through the local I/O line can be prevented form being attenuated.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A semiconductor memory device, comprising:
a plurality of column groups each of which includes a plurality of column memory blocks;
a column decoder for selecting a column group from the column groups in response to one bit or some bits of a column address signal and addressing column memory blocks of the selected column group in response to remaining bits of the column address signal; and
a plurality of main local I/O line groups that are selectively connected to the column memory blocks in response to operation of the column decoder, wherein the column decoder includes
a select circuit that transfers the remaining bits of the column address signal to a column group in response to some of bits of the column address signal;
a plurality of address drivers that transfer the remaining bits of the column address signal to the column groups, wherein each address driver is connected to output of the select circuit and the number of the address drivers is same as the number of the column groups; and
a plurality of decoding units that decode the remaining bits, wherein each decoding unit is connected to the address driver and the number of the decoding units is same as the number of the column groups.

2. The semiconductor memory device as claimed in claim 1, wherein the respective column groups include same number of column memory blocks.

3. The semiconductor memory device as claimed in claim 1, wherein the respective decoding units include a plurality of address decoders which are respectively connected to the each column memory blocks and the respective address decoders output $2^n$ (the 'n' is the number of the remaining bits) column decoding signals.

4. The semiconductor memory device as claimed in claim 1, wherein the plurality of column groups divide into a first column group and a second column group and the column groups include same number of column memory blocks.

5. The semiconductor memory device as claimed in claim 4, wherein the column decoder selects a column group between the first and second column group in response to a logic value of one bit of the column address signal and addresses column memory blocks of the selected column group in response to remaining bits of the column address signal.

6. The semiconductor memory device as claimed in claim 4, wherein the column decoder includes a select circuit that transfers the remaining bits of the column address signal to a column group between the first and second column group in response to the logic value of one bit of the column address signal;
a first address driver that transfer the remaining bits of the column address signal to the first column group;
a second address driver that transfer the remaining bits of the column address signal to the second column group, wherein the address drivers are connected to output of the select circuit;
a first decoding unit that is connected to the first address driver and decode the remaining bits; and
a second decoding unit that is connected to the second address driver and decode the remaining bits.

7. The semiconductor memory device as claimed in claim 6, wherein the plurality of main local I/O line groups divide into a first set of main local I/O line group and a second set of main local I/O line group and the number of the main local I/O lines of each set is same as the number of IO pads.

8. The semiconductor memory device as claimed in claim 6, wherein the respective column groups include 4 column memory blocks and the respective decoding units include 4 address decoders respectively connected to the each column memory block.

9. The semiconductor memory device as claimed in claim 6, wherein the respective column groups include 2 column memory blocks and the respective decoding units include 2 address decoders respectively connected to the each column memory block.

10. The semiconductor memory device as claimed in claim 1, wherein the plurality of column groups divide into a first column group, a second column group, a third column group and a fourth column group and the column groups include same number of column memory blocks.

11. The semiconductor memory device as claimed in claim 10, wherein the column decoder selects a column group between the first and fourth column group in response to a logic value of two bit of the column address signal and addresses column memory blocks of the selected column group in response to remaining bits of the column address signal.

12. The semiconductor memory device as claimed in claim 10, wherein the column decoder includes a select circuit that transfers the remaining bits of the column address signal to a column group between the first and fourth column group in response to the logic value of two bit of the column address signal;
a first address driver that transfer the remaining bits of the column address signal to the first column group;
a second address driver that transfer the remaining bits of the column address signal to the second column group;
a third address driver that transfer the remaining bits of the column address signal to the third column group;
a fourth address driver that transfer the remaining bits of the column address signal to the fourth column group, wherein the address drivers are connected to output of the select circuit;
a first decoding unit that is connected to the first address driver and decode the remaining bits;
a second decoding unit that is connected to the second address driver and decode the remaining bits;
a third decoding unit that is connected to the third address driver and decode the remaining bits; and
a fourth decoding unit that is connected to the fourth address driver and decode the remaining bits.

13. The semiconductor memory device as claimed in claim 12, wherein the plurality of main local I/O line groups divide into a first set of main local I/O line group, a second set of main local I/O line group, a third set of main local I/O line group and a fourth set of main local I/O line group and the number of the main local I/O lines of each set is same as the number of IO pads.

14. The semiconductor memory device as claimed in claim 12, wherein the respective column groups include 4 column memory blocks and the respective decoding units include 4 address decoders respectively connected to the each column memory block.

15. The semiconductor memory device as claimed in claim 12, wherein the respective column groups include 2 column memory blocks and the each decoding units include 2 address decoders respectively connected to the each column memory block.

16. The semiconductor memory device as claimed in claim 1 further comprising, a plurality of sense amplifier groups amplifies internal data, which are received from a corresponding one of the plurality of column groups, and outputs the amplified data to global I/O lines; and
   a data I/O circuit that outputs output data to I/O pads in response to amplified data, which are received through global I/O lines.

17. A semiconductor memory device, comprising:
   a first column group and a second column group each of which includes a plurality of column memory blocks;
   a column decoder for selecting a column group from the column groups in response to one bit of a n bits column address signal and addressing column memory blocks of the selected column group in response to remaining bits of the column address signal; and
   a first set of main local I/O line group and a second set of main local I/O line group that are selectively connected to the column memory blocks in response to addressing operation of the column decoder,
   wherein the column decoder includes
   a select circuit that transfers the remaining bits of the column address signal to a column group between the first and second column group in response to the logic value of one bit of the column address signal;
   a first address driver and a second address driver that respectively transfer the remaining bits of the column address signal to the first column group and the second column group, wherein each address driver is connected to output of the select circuit; and
   a first decoding unit and a second decoding unit that decode the remaining bits, wherein each decoding unit is respectively connected to the address driver.

18. The semiconductor memory device as claimed in claim 17, wherein the respective decoding units include a plurality of address decoders which are respectively connected to the each column memory blocks and the respective address decoders output 2^(n−1) column decoding signals.

19. The semiconductor memory device as claimed in claim 17, wherein the respective column groups include 4 column memory blocks and the respective decoding units include 4 address decoders respectively connected to the each column memory block.

20. The semiconductor memory device as claimed in claim 17, wherein the respective column groups include 2 column memory blocks and the respective decoding units include 2 address decoders respectively connected to the each column memory block.

21. A semiconductor memory device, comprising:
   a first column group, a second column group, a third column group and a fourth column group each of which includes a plurality of column memory blocks;
   a column decoder for selecting a column group from the column groups in response to two bits of a n bits column address signal and addressing column memory blocks of the selected column group in response to remaining bits of the column address signal; and
   a first set of main local I/O line group, a second set of main local I/O line group, a third set of main local I/O line group and a fourth set of main local I/O line group that are selectively connected to the column memory blocks in response to addressing operation of the column decoder,
   wherein the column decoder includes
   a select circuit that transfers the remaining bits of the column address signal to a column group between the first and fourth column group in response to the logic values of two bits of the column address signal;
   a first address driver, a second address driver, a third address driver and a fourth address driver that respectively transfer the remaining bits of the column address signal to the first column group, the second column group, the third column group and the fourth column group, wherein each address driver is connected to output of the select circuit; and
   a first decoding unit, a second decoding unit, a third decoding unit and a third decoding unit that decode the remaining bits, wherein each decoding unit is respectively connected to the address driver.

22. The semiconductor memory device as claimed in claim 21, wherein the respective decoding units include a plurality of address decoders which are respectively connected to the each column memory blocks and the respective address decoders output 2^(n−2) column decoding signals.

23. The semiconductor memory device as claimed in claim 21, wherein the respective column groups include 4 column memory blocks and the respective decoding units include 4 address decoders respectively connected to the each column memory block.

24. The semiconductor memory device as claimed in claim 21, wherein the respective column groups include 2 column memory blocks and the respective decoding units include 2 address decoders respectively connected to the each column memory block.

* * * * *